United States Patent [19]
George

[11] 3,898,567
[45] Aug. 5, 1975

[54] CRYSTAL-LOCK TUNING SYSTEM FOR TUNING REGULARLY AND IRREGULARLY SPACED CHANNEL FREQUENCIES

[75] Inventor: John Barrett George, Indianapolis, Ind.

[73] Assignee: RCA Corporation, New York, N.Y.

[22] Filed: June 3, 1974

[21] Appl. No.: 476,084

[52] U.S. Cl. ......... 325/470; 178/DIG. 15; 325/335; 325/421; 325/423; 325/438; 325/453; 325/459; 325/460; 325/464; 325/468; 334/14

[51] Int. Cl. ............................................. H04b 1/16

[58] Field of Search ..... 178/DIG. 15; 325/335, 430, 325/435, 438, 452, 453, 458–461, 464, 465, 468–470, 418–423; 334/11, 14, 15, 18; 331/4, 18, 23, 32, 37, 41, 179; 340/171 A, 147 C

[56] References Cited

UNITED STATES PATENTS

| | | | |
|---|---|---|---|
| 3,641,434 | 2/1972 | Yates et al. | 325/17 |
| 3,803,495 | 4/1974 | Reynolds | 325/470 |
| 3,839,678 | 10/1974 | Bell | 325/468 |

*Primary Examiner*—Robert L. Griffin
*Assistant Examiner*—Marc E. Bookbinder
*Attorney, Agent, or Firm*—Eugene M. Whitacre

[57] ABSTRACT

A tuning system for tuning regularly spaced and irregularly spaced channel frequencies wherein a plurality of harmonically related frequency signals separated by the regular channel spacing are utilized as reference signals. A sample of the tuner local oscillator signal is either compared directly in a frequency discriminator with the reference signals when regularly spaced channel frequencies (e.g., 6 MHz apart) are to be selected, or is translated in frequency prior to comparison in the discriminator when irregularly spaced channel frequencies are to be selected. When the irregularly spaced channel frequencies are being received, an auxiliary oscillator operating at a fixed frequency [e.g., (6N + 4) MHz where N is any integer] is mixed with the sample of the tuner local oscillator signal to develop a translated sample of the oscillator signal. Furthermore, the local oscillator signal itself is frequency shifted (e.g., by +4 MHz) to the irregular frequency. The translated sample of the oscillator signal (but not the oscillator signal) will therefore differ in the same manner from a harmonic of the regular channel spacing as the regular spaced channel frequencies.

21 Claims, 3 Drawing Figures

PATENTED AUG 5 1975 3,898,567

SHEET 2

CRYSTAL-LOCK TUNING SYSTEM FOR TUNING REGULARLY AND IRREGULARLY SPACED CHANNEL FREQUENCIES

BACKGROUND OF THE INVENTION

This invention relates to television tuning systems and more particularly to a system for tuning regularly spaced and irregularly spaced channel frequencies.

A tuning system which provides for the selection of any one of a plurality of television channels in a plurality of bands of radio frequencies is disclosed in my co-pending application Ser. No. 476,081, (filed June 3, 1974), filed concurrently herewith and entitled, MULTIBAND RANDOM CHANNEL ADDRESS CRYSTAL-LOCK TUNING SYSTEM. To access a given channel, a signal representative of a channel number is inserted into a memory and an oscillator or oscillators of one or more associated tuners are sequentially swept through the bands of oscillator frequencies. For example, in a system constructed to operate under standards employed in the United States, a first oscillator is swept through the low and high VHF band oscillator frequencies, after which a second oscillator is swept through the UHF oscillator frequencies. As the oscillator is swept, the oscillator signal is compared to a plurality of harmonically related signals spaced apart by a frequency equal to the separation between regularly spaced television channels. A counter accumulates a count representative of a number of predetermined frequency difference conditions encountered during a period of sweeping of the oscillator. When the count inserted in the memory equals the count accumulated in the counter, sweeping of the oscillator is stopped. The frequency of the oscillator signal is then stabilized by comparing the oscillator frequency to the output frequency component of the harmonic generator nearest the oscillator frequency. Non-uniform treatment of the signal in the case, for example, when tuning U.S. Channel 5 or Channel 6, is made necessary by the fact that oscillator signal frequencies for those channels are not related to the output frequency components of the harmonic generator in the same manner as other channels in the same band. For example, under U.S. standards, the oscillator signals required to tune channels 2, 3, and 4 (101, 107, and 113 MHz, respectively) are 1 MHz lower than the nearest harmonics of 6 MHz, while the oscillator signals required to tune channels 5 and 6 (123 and 129 MHz, respectively) are interposed halfway between harmonics of 6 MHz (3 MHz removed from each of two harmonics).

When the irregularly spaced channel 5 or 6 is selected and an appropriate count has been accumulated in the counter, the oscillator signal frequency is at 119 or 125 MHz, respectively, and therefore must be shifted by 4 MHz to place it at a frequency suitable for receiving the irregularly spaced channels. After the oscillator signal frequency has been shifted 4 MHz, a mixing of the oscillator signal frequency with harmonics of 6 MHz results in a beat frequency signal of 3 MHz. A 0–3 MHz beat frequency filter is used to filter out all but a dominant beat frequency signal; therefore, regardless of whether the oscillator signal increases or decreases from the shifted frequency, the dominant beat frequency decreases. A discriminator of the type suitable for stabilizing the oscillator signal frequency relative to one harmonic of 6 MHz when receiving regularly spaced channels would not be suitable for stabilizing the oscillator signal frequency when receiving the irregularly spaced channels.

SUMMARY OF THE INVENTION

In accordance with the present invention, a television tuning system includes a tuning means for receiving radio frequency signals corresponding to any one of a plurality of television channels and having a tunable local oscillator means for producing a corresponding oscillator signal. Certain of the oscillator signal frequencies have a uniform frequency of separation and at least one of the oscillator frequencies having a different frequency of separation from an adjacent channel oscillator frequency. Sweep generator means is coupled to the oscillator means for varying the tuning thereof in a predetermined manner. Signal generating means produces a plurality of reference signals at frequencies having the uniform frequency separation. Frequency translating means is coupled to the local oscillator means for selective translation of the oscillator signal frequencies. Frequency discriminator means has first and second inputs coupled to the frequency translating means and to the signal generating means, respectively. Frequency discriminator means produces an output signal representative of frequency differences between the output signal of the frequency translating means and each of the reference signals as the tuning is varied. Counting means is coupled to the discriminator means for producing an output count representative of the oscillator signal passing through a predetermined frequency relationship with respect to each of the reference signals. Channel selector means produces a stored count representative of a selected television channel. Comparator means is coupled to the counting means and to the channel selector means for providing a hold signal to the sweep generator means in response to a match between the output count and the stored count, thereby terminating the variation of the oscillator frequency. The decoder means is coupled to the counting means for identifying the presence of at least one particular output count. The particular output count and the hold signal provides for the translation of the oscillator signal frequencies. Frequency shifting means is coupled to the frequency translating means for changing the oscillator frequency by the different frequency of separation and the uniform frequency of separation.

DETAILED DESCRIPTION

While this invention may be utilized where various channel spacings are employed, it will be described in the context of the channel allocations employed in the United States to avoid undue complication of any understanding of the invention. In particular, the system will be described with reference to the irregularly spaced frequencies associated with VHF channels 5 and 6 in the United States. It should be recognized that where different channel spacing and frequency allocations are used, appropriate changes would be made with respect to the particular frequencies referred to hereinafter.

Figure 1:
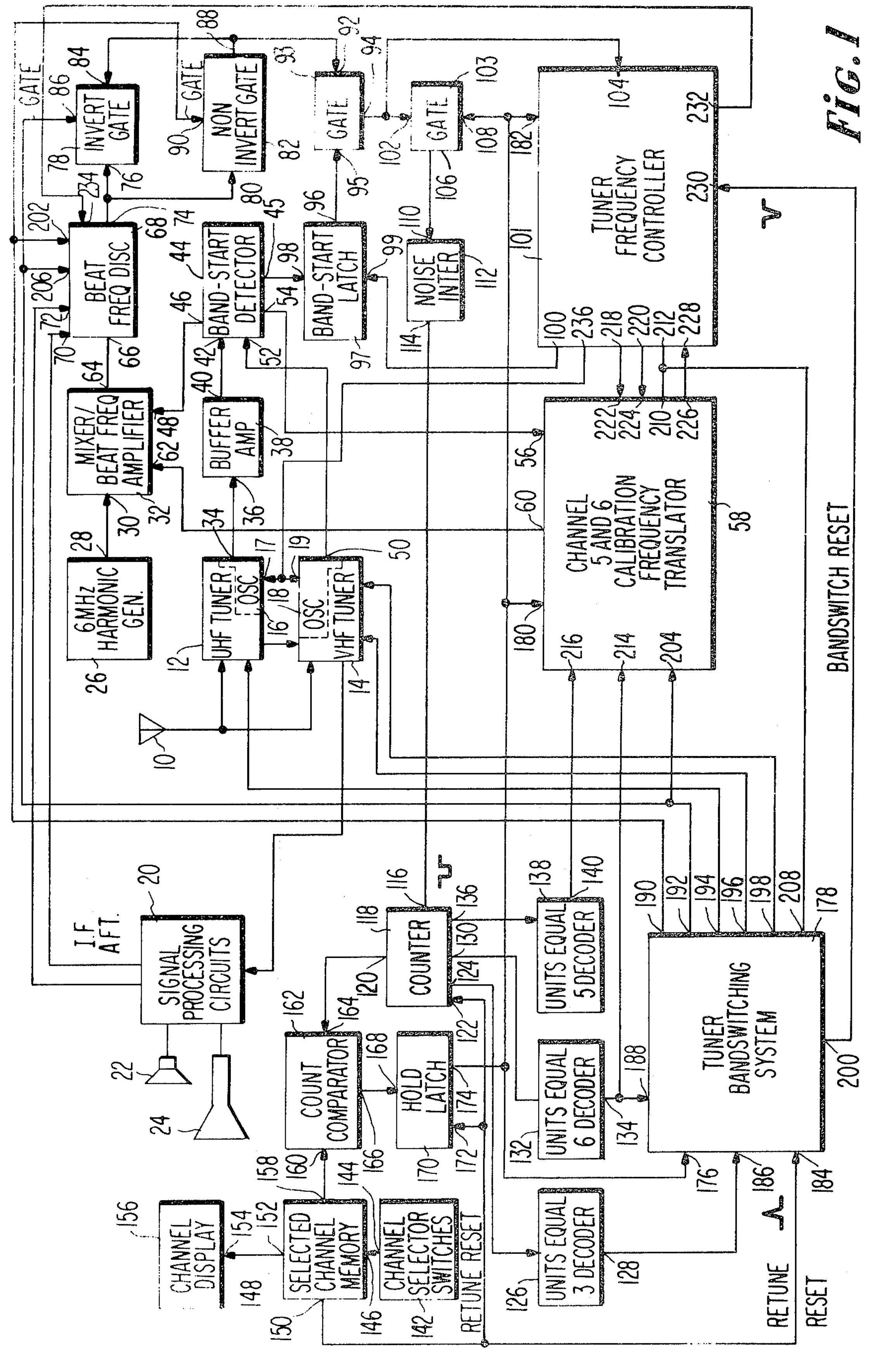
FIG. 1 illustrates in block form a television receiver including a tuning system incorporating the present invention.

In FIG. 1, a television receiver system is shown in block form. In the system of FIG. 1, details of which are set forth in my above-referenced copending application, channel numbers are entered into the tuning system of the television receiver by means of channel selector switches 142. As each digit of the channel number is entered, the data is transferred to a selected channel memory 148. The channel number data which is held in memory also is coupled to channel display 156. Upon the completion of a selection of the second digit of a channel number, a reset pulse is generated by the selected channel memory 148 and is coupled via a terminal 150 to a terminal 122 of a counter 118, a terminal 172 of a hold latch 170, and to a terminal 184 of a tuner bandswitch system 178. The reset pulse applied to counter 118 provides a reset of the counter 118 to a "00" count stage. The reset pulse applied to hold latch 170 provides for zero volts at a terminal 174 of hold latch 170. The reset pulse applied to tuner bandswitch system 178 provides for a reset of tuner bandswitching system 178 to a low VHF band tuning condition and produces a bandswitch reset pulse at a terminal 200 which is coupled to a terminal 230 of a tuner frequency controller 101. The bandswitch reset pulse applied to tuner frequency controller 101 resets the voltage at a terminal 236 to zero volts and produces a reset pulse at a terminal 100 of the tuner frequency controller 101. The reset pulse at terminal 100 is coupled to a terminal 99 of a bandstart latch 97, which produces a zero volt condition at a terminal 96. The zero voltage at terminal 96 is coupled to a terminal 95 of a gate 93 to disable gate 93 and thereby prevent signal flow between a terminal 92 and a terminal 94 of the gate 93.

The terminal 174 of hold latch 170 is coupled to a terminal 176 of tuner bandswitch system 178, to a terminal 180 of a channel 5 and 6 calibration frequency translator 58, to a terminal 108 of a gate 103, and a terminal 182 of the tuner frequency controller 101. With the zero volts supplied by hold latch 174 to the terminal 108 of gate 103, signal can flow between a terminal 102 and a terminal 106. With zero volts on terminal 182 of the tuner frequency controller 101, that apparatus is arranged to produce a ramp voltage output, i.e., the voltage at the terminal 236 becomes more positive as a function of time. This ramp voltage output is coupled to a terminal 17 of an oscillator 16 of a UHF tuner 12 and to a terminal 19 of an oscillator 18 of a VHF tuner 14. As the voltage on terminal 236 becomes more positive, the frequency of the oscillator 19 increases (oscillator 16 not operational when sweeping the low VHF band). A sample of the oscillator signal existing at a terminal 50 of the oscillator 18 is coupled to a terminal 52 of a bandstart detector 44.

When the signal of the oscillator 18 reaches a predetermined frequency (for example, 93 MHz which is 8 MHz below the oscillator frequency for U.S. channel 2), a positive voltage change will occur at a terminal 45 signifying that oscillator 18 will soon pass through 95 MHz, a frequency 6 MHz below the channel 2 frequency, thus providing for a "01" count and subsequent coordination of count and channel number. This positive voltage at terminal 45 is coupled to a terminal 98 of the bandstart latch 97 to set the bandstart latch and create a positive voltage at the terminals 96 and 95. Gate 93 is thereby enabled and provides for signal flow between the terminals 92 and 94.

Figure 2:
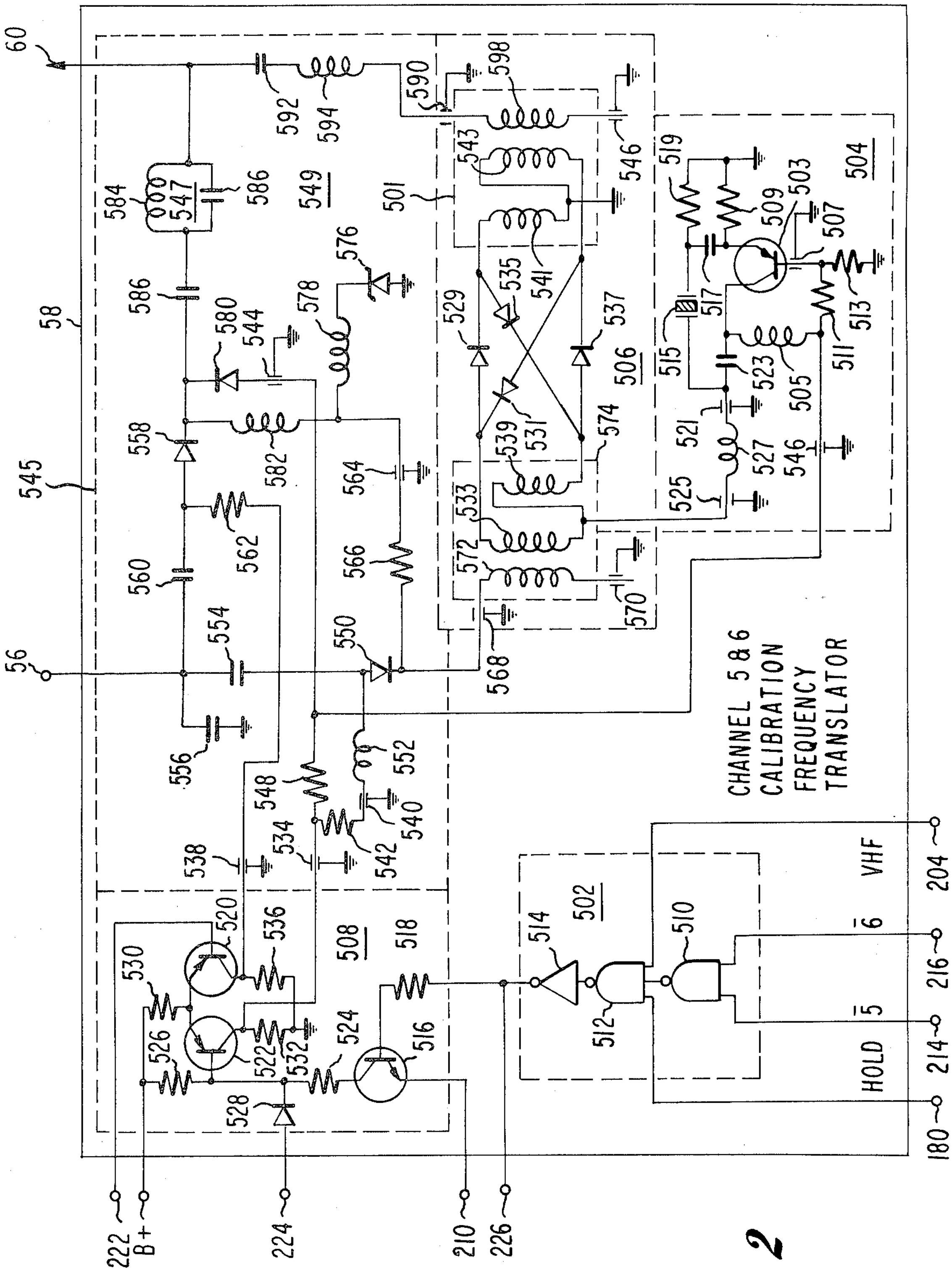
FIG. 2 illustrates in schematic form a frequency translator constructed in accordance with the present invention.

The oscillator signal at terminal 52 of the bandstart detector 44 is also coupled to a terminal 54 of the bandstart detector 44, which is coupled to a terminal 56 of the channel 5 and 6 calibration frequency translator 58, to be described in more detail in conjunction with FIG. 2. Counter 118 has not yet received pulses at a terminal 116 which would advance the count from the "00" count. In that case, the oscillator signal at terminal 56 will be directly coupled without change to a terminal 60 of the channel 5 and 6 calibration frequency translator 58. The oscillator signal appearing at the terminal 60 is coupled to a terminal 62 of a mixer/-beat frequency amplifier 32.

A 6 MHz harmonic generator 26 generates harmonics of 6 MHz, which harmonics are coupled to a terminal 30 of the mixer/beat frequency amplifier 32. Signals existing at the terminal 30 and the terminal 62 of the mixer/beat frequency amplifier 32 are mixed, the resultant is filtered and amplified, and the best or difference frequency appears at a terminal 64. The terminal 64 is coupled to a terminal 66 of the beat frequency discriminator 68 where the beat frequency is compared to a predetermined frequency range typically centered around 1 MHz. If the beat frequency is greater than the limit of the predetermined range of frequencies, a zero voltage appears at a terminal 74. If the beat frequency is less than the predetermined range of frequencies, a positive voltage appears at terminal 74. The change in voltage at terminal 74 therefore creates pulses as the oscillator 18 is swept through a range of frequencies greater than the spacing between channels.

Pulses appearing at the terminal 74 are coupled to terminal 92 of the gate 93 either by invert gate 78 (during VHF reception) or non-invert gate 82 (during UHF reception). Signals existing at terminal 92 are coupled via the gate 93, the gate 103, and a noise integrator 112 to terminal 116 of the counter 118. Counting of the pulses generated at the terminal 74 of the beat frequency discriminator 68 provides the necessary information to determine to which channel the tuner 14 is tuned. When the data in the counter 118 equals the data in the selected channel memory 148, the count comparator 162 produces a positive voltage at a terminal 166 of the count comparator 162. This positive voltage sets the hold latch 170 and creates a positive voltage on the terminal 174 of the hold latch 170. The tuner frequency controller then stops sweeping the voltage at the terminal 236 and the gate 103 inhibits the flow of signal between terminal 102 and terminal 106.

When channel 5 and 6 is selected by the channel selector switches 142, and the counter 118 has reached a count of "05" or "06", respectively (VHF oscillator 18 at 119 or 125 MHz, respectively), the channel 5 and 6 calibration frequency translator 58 (details of which are described below in connection with FIG. 2) mixes the signal at the terminal 56 with a signal generated by a crystal-controlled oscillator within the calibration frequency translator 58 to develop a translated oscillator signal. Also, a positive voltage is applied to terminal 228 of tuner frequency controller 101 resulting in a +4 MHz frequency shift in the VHF oscillator 18. The crystal-controlled oscillator is arranged to operate at a frequency which will place the translated, shifted oscillator frequency approximately 1 MHz below a harmonic of 6 MHz. An appropriate frequency which may be employed is 52 MHz as will be explained below. The translated, shifted frequency is coupled to terminal 60. This non-uniform treatment of the signal at terminal 56 when tuning channel 5 or channel 6 is made necessary by the fact that the oscillator frequencies required for the reception of channels 5 and 6 are halfway between two harmonics of 6 MHz, thus requiring a frequency translation of the oscillator frequency to make possible the use of a discriminator for stabilizing the oscillator frequency for channel 5 or 6.

If high band VHF channels (7–13) are selected by the channel selector switches 142, the tuner bandswitch system 178 switches from low band VHF to high band VHF after the counter 118 has accumulated six pulses and the voltage at terminal 174 is zero. If UHF has been selected by the channel selector switches 142, tuner bandswitch system 178 switches from low band VHF to high band VHF when counter 118 has accumulated six pulses and switches from high band VHF to UHF when the counter 118 has accumulated thirteen pulses and the voltage at terminal 174 is zero. When then tuner bandswitch system 178 switches from one band to the next, the bandswitch reset pulse occurring at the terminal 200 resets the tuner frequency controller 101, resetting the bandstart latch 97 and resetting the voltage at the terminal 236 to zero volts.

When tuning signals in the UHF band, the oscillator 16 is varied in frequency by means of the voltages applied to terminal 17 in much the same way as the oscillator 18 is varied in frequency during VHF signal reception. A sample of the oscillator signal existing at a terminal 34 is coupled via a terminal 36 to a buffer amplifier 38. The buffer amplifier 38 reduces the coupling of 6 MHz harmonic signals into the oscillator 16, thereby reducing interference in the UHF tuner 12. An amplified version of the sample oscillator signal from oscillator 16 exists at a terminal 40 and is coupled to the bandstart detector 44 via terminal 42. A pulse is produced at the terminal 45 at the beginning of the UHF band in a similar manner as pulses were produced at terminal 45 at the beginning of the tuning of the low VHF band and the high VHF band.

In FIG. 2, which has its external terminals connected in the system as indicated in FIG. 1, a channel 5 and 6 calibration frequency translator 58 comprises an AND circuit 502, a 52 MHz crystal controlled oscillator 504, a balanced mixer circuit 506, and a power switching circuit 508. The AND circuit 502 comprises a dual input NAND gate 510 having one gate coupled to terminal 216 and the other gate coupled to terminal 214. The output of the dual input NAND gate 510 is coupled to one input of a triple input NAND gate 512. The second input of the triple input NAND gate 512 is coupled to terminal 180 and the third input of triple input NAND gate 512 is coupled to terminal 204. The output of triple input NAND gate 512 is coupled to the input of inverting amplifier 514. The output of inverting amplifier 514 is coupled to the terminal 226. A switching transistor 516 has a base electrode coupled to the output of inverting amplifier 514 by means of a resistor 518 and an emitter coupled to terminal 210.

A power switching transistor 520 provides for B+ switching to allow coupling of the VHF oscillator signal on terminal 56 to the terminal 60. A power switching transistor 522 provides for mixing of the VHF oscillator signal at terminal 56 with a 52 MHz output signal derived from a 52 MHz oscillator 504 to obtain at terminal 60 a translated signal having a frequency that is 52 MHz less than the VHF oscillator signal on terminal 56. The power switching transistor 522 has a base electrode coupled to the collector of switching transistor 516 by means of a resistor 524, to B+ by means of a resistor 526, and to the cathode of a diode 528. The anode of diode 528 is coupled to terminal 224. The emitter of transistor 522 is coupled to B+ by means of a resistor 530. The collector of transistor 522 is coupled to reference potential by means of a resistor 532 and to the isolated terminal of a feedthrough capacitor 534.

Power switching transistor 520 has a base electrode coupled to terminal 222, an emitter electrode coupled to the emitter electrode of power switching transistor 522, and a collector electrode coupled to reference potential by means of a resistor 536. The collector electrode of transistor 520 is also coupled to the isolated terminal of a feedthrough capacitor 538. The isolated terminal of feedthrough capacitor 534 is coupled to the isolated terminal of a feedthrough capacitor 540 by means of a resistor 542 and is coupled to the isolated terminal of a feedthrough capacitor 544 and the isolated terminal of a feedthrough capacitor 546 by means of a resistor 548. The isolated terminal of the feedthrough capacitor 540 is coupled to the anode of a diode 550 by means of an RF choke 552. The anode of diode 550 is also coupled to terminal 56 by means of a capacitor 554. The terminal 56 is coupled to reference potential by means of a capacitor 556 and is coupled to the anode of diode 558 by means of a capacitor 560. The anode of diode 558 is also coupled to the isolated terminal of feedthrough capacitor 538 by means of a resistor 562.

The cathode of diode 550 is coupled to the isolated terminal of feedthrough capacitor 564 by means of a resistor 566 and to the isolated terminal of a feedthrough capacitor 568. The isolated terminal of feedthrough capacitor 568 is coupled to the isolated terminal of feedthrough capacitor 570 by means of the primary winding 572 of transformer 574. Feedthrough capacitor 568, feedthrough capacitor 570 and the primary winding 572 form a resonant circuit 59 having a resonance of 124 MHz with a bandwidth of 12 MHz. This frequency spectrum includes the oscillator frequencies required to tune channels 5 and 6.

The isolated terminal of feedthrough capacitor 564 is coupled to the cathode of a zener diode 576 by means of an RF choke 578. The anode of zener diode 576 is coupled to reference potential. The isolated terminal of feedthrough capacitor 564 is also coupled to the cathode of diode 558 and the cathode of a diode 580 by means of an RF choke 582. The anode of diode 580 is coupled to the isolated terminal of feedthrough capacitor 544. The cathode of diode 580 is also coupled to a first terminal of a bandpass filter 547 comprising the parallel combination of an inductor 584 and a capacitor 586 by means of a capacitor 588. The second terminal of the bandpass filter is coupled to terminal 60.

The terminal 60 is also coupled to the isolated terminal of a feedthrough capacitor 590 by means of a series combination of a capacitor 592 and an inductor 594.

The capacitor 592 and the inductor 594 form a bandpass resonant circuit 549. The bandpass filters 547 and 549 are resonant at approximately 72 MHz and have a bandwidth of approximately 12 MHz. This frequency spectrum includes the oscillator frequencies required to tune channels 5 and 6 minus 52 MHz. The isolated terminal of feedthrough capacitor 590 is coupled to the isolated terminal of feedthrough capacitor 596 by means of a secondary winding 598 of transformer 501.

An oscillator transistor 503 in the 52 MHz oscillator circuit 504 has a collector electrode coupled to the isolated terminal of feedthrough capacitor 546 by means of an RF choke 505, a base electrode coupled to an isolated terminal of feedthrough capacitor 507, and an emitter electrode coupled to reference potential by means of a resistor 509. The series combination of a resistor 511 and a resistor 513 is coupled between the isolated terminal of feedthrough capacitor 546 and reference potential. The common connection of resistors 511 and 513 is coupled to the isolated terminal of feedthrough capacitor 507. The emitter of oscillator transistor 503 is also coupled to a first terminal of a 52 MHz crystal 515 by means of a capacitor 517. The first terminal of the 52 MHz crystal is also coupled to reference potential by means of a resistor 519. The collector of oscillator transistor 503 is also coupled to the isolated terminal of a feedthrough capacitor 521 and a second terminal of 52 MHz crystal 515 by means of a capacitor 523. The isolated terminal of feedthrough capacitor 521 is also coupled to the isolated terminal of a feedthrough capacitor 525 by means of an RF choke 527. The feedthrough capacitor 521, the feedthrough capacitor 525 and the RF choke 527 form a low pass filter for the 52 MHz oscillator signal coupled to balanced mixer 506.

In the balanced mixer circuit 506, the isolated terminal of feedthrough capacitor 525 is coupled to the anode of a diode 529 and the cathode of a diode 531 by means of a secondary winding 533 of transformer 574. The isolated terminal of feedthrough capacitor 525 is also coupled to a cathode of diode 535 and the anode of a diode 537 by means of a secondary winding 539 of transformer 574. The secondary windings 533 and 539 are coupled to the primary winding 572 in a manner to provide for a voltage at the anode of diode 529 which is 180° out of phase with that voltage at the anode of diode 537.

The cathode of diode 529 and the anode of diode 535 are coupled to reference potential by means of a primary winding 53 of transformer 501. The windings 541 and 543 are coupled to the secondary winding 598 in a manner to provide for maximum output voltage across the winding 598.

In operation, when the channel 5 and 6 calibration frequency translator 58 is utilized as a part of the tuning system of FIG. 1, voltages existing on terminals 180, 204, 214 and 216 determine the relationship between the frequency of the signal entering terminal 56 and the frequency of the signal leaving terminal 60. With certain sets of voltages on these terminals, the signal at terminal 60 is translated to a frequency 52 MHz less than the frequency of the signal at terminal 56 and with other sets of voltages on these terminals, the signal at terminal 60 has a frequency equal to the frequency of the signal at terminal 56.

The translation of frequency between the terminals 56 and 60 is provided when the tuning system is tuned, for example, to channel 5 or 6. Under the channel allocation standards employed in the United States, oscillator frequencies of these channels are not related to harmonics of 6 MHz in the same manner as other low VHF band channels. Translation of the oscillator signal of the VHF tuner is provided to utilize a common frequency control system which makes reference to the harmonics of the 6 MHz harmonic generator.

Various frequencies may be used for translation of the oscillator signal frequency. In the illustrated case, a translation wherein the sample of the local oscillator signal is mixed with a 4 MHz signal to produce a translated signal having a frequency 4 MHz less than the local oscillator signal frequency will place the difference frequency produced by the mixer/beat frequency amplifier 32 at 1 MHz when the oscillator is properly tuned for channel 5 or 6 (as it is for other channels). Thus, any frequency which is 4 MHz plus any integer multiple of 6 MHz (including "zero") is suitable for translation. In the illustrated case, 52 MHz was selected to provide a frequency outside the RF pass band of the VHF tuner of the television receiver, to provide a difference frequency between the oscillator signal and the signal at terminal 56 which was 1 MHz below a harmonic of the 6 MHz harmonic generator, and to provide a frequency which is 10.75 MHz less than the audio IF frequency of the television receiver. The first selection criteria was arrived at to maintain acceptable performance of the television receiver without making too critical the task of shielding the 52 MHz signal from the antenna terminals of the television receiver. The second selection criteria was arrived at to provide consistent performance of the tuning system throughout the VHF band. That is to say, all VHF oscillator frequencies coupled to the mixer/beat frequency amplifier 32 are 1 MHz less than a harmonic of the 6 MHz harmonic generator 26 when proper tuning is obtained. The third selection criteria permits dual use of the 52 MHz oscillator, one in the tuning system and the other in providing for the use of a standard 10.7 MHz IF FM integrated circuit for both television and FM radio receivers. This dual use of the 52 MHz oscillator would provide for a defraying of the cost of the 52 MHz oscillator circuitry.

The following is a detailed description of the operation of the channel 5 and 6 calibration frequency translator 58 during frequency translation and during non-frequency translation.

Frequency Translation

With a hold signal on terminal 180, a signal on terminal 204 indicating the tuner bandswitch system 178 is in VHF and a signal on terminals 214 and 216 indicating the counter 118 contains an "O5" or "06" count (all "positive" inputs to gate 512), the output of triple input NAND gate 512 is zero, and the outputs of inverting amplifier 514 and terminal 226 are positive. The base-emitter junction of switching transistor 516 will be forward biased, thereby producing saturation of first switching transistor 522 and cutoff of the second switching transistor 520. The voltage at the collector of power switching transistor 520 is equal to approximately zero volts. The collector voltage of power switching transistor 522, however, is equal to approximately B+.

With approximately B+ on the collector of transistor 522, current will flow through resistor 542, inductor 552, diode 550, resistor 566, inductor 578 and zener diode 576. Also, current will flow through resistor 548, diode 580, inductor 582, inductor 578 and zener diode 576. Additionally, current will flow through resistor 548 to supply current into the 52 MHz oscillator 504.

The curent that flows through diode 550 will reduce the impedance of this diode to provide for oscillator signal flow from the VHF oscillator 18 (FIG. 1) into the input transformer 574 via feedthrough capacitor 568. At the same time, diode 558, which is reverse biased, provides for a high impedance path for signals from terminal 56. Additional attenuation of the signal at the cathode of diode 558 is provided for by means of the forward bias diode 580 which exhibits a very low impedance and whose anode is bypassed to reference potential by means of the feedthrough capacitor 544. The attenuation of signal at the cathode of diode 558 minimizes the direct coupling of signals on terminal 56 to terminal 60.

With a voltage of approximately 15 volts on the cathode of diode 580, there is a voltage of approximately 15.7 volts on the anode of diode 580. With approximately 15.7 volts on the anode of diode 580, the oscillator circuit 504 is activated and produces a 52 MHz sinusoidal signal which is coupled to the input transformer 574 of balanced mixer circuit 506.

With the input signal from terminal 56 applied to the input transformer 574 and the 52 MHz oscillator signal applied to the transformer 574, a mixing action occurs by means of the diodes 529, 531, 535 and 537 to produce in the output transformer 501 signals equal to the frequency of the signal at terminal 56 plus and minus 52 MHz. The translated signal is coupled to terminal 60 by means of the series combination of capacitor 592 and inductor 594 which provides for an attenuation of the components of signal other than the difference between the signal frequency at terminal 56 and the oscillator signal derived from 52 MHz oscillator 504. Additionally, the parallel combination of inductor 584 and capacitor 586, in combination with capacitor 588, forward bias diode 580 and the feedthrough capacitor 544 to provide for shunt attenuation of signals at terminal 60 other than the difference frequency between the signal at terminal 56 and the signal produced by the 52 MHz oscillator 504.

Non-Translation

In the absence of a hold signal on terminal 180, a signal on terminal 204 indicating the tuner bandswitching system 178 is in VHF or a signal on terminal 214 or 216 indicating the counter contains an "05" or "06" count, the output of triple input NAND gate is positive and the output of inverting amplifier 514 is zero volts. The voltage at terminal 226 then is zero, the switching transistor 516 is cut off, the first switching transistor 522 is cut off, and the second switching transistor 520 is saturated. The voltage at the collector of transistor 520 therefore is equal to approximately B+. Under these conditions, current flows through resistor 562, diode 558, inductor 582, inductor 578 and zener diode 576. The current flow through diode 558 provides for a low impedance path for current flow between terminal 56 and terminal 60 via capacitor 560, diode 558, capacitor 588, and the parallel combination of inductor 584 and capacitor 586. Because of the zener diode 576, the cathode voltage at the diode 558 is approximately 15 volts. With zero volts on the collector of power switching transistor 522, the voltage on the anode of diode 550 and the anode of diode 580 is also approximately zero. Since the cathodes of diodes 550 and 580 are coupled to the zener diode 576 and thereby are at approximately 15 volts, both diodes are reverse biased and present a high impedance to signals on the terminal 56 and decouple the balanced mixer circuit 506 and the 52 MHz crystal controlled oscillator from the signal at terminals 56 and 60.

Thus, it can be seen that signals at terminal 56 may be directly coupled to terminal 60 or may be translated to a frequency 52 MHz less than the frequency at terminal 56. In the context of the system of FIG. 1, the selective translation of signals at terminal 56 provides for a coupling of a signal to the mixer/beat frequency amplifier 32 which when mixed with harmonics of 6 MHz will yield a beat frequency appropriate to frequency stabilize the oscillator signals of all VHF channels in a uniform manner.

Figure 3:
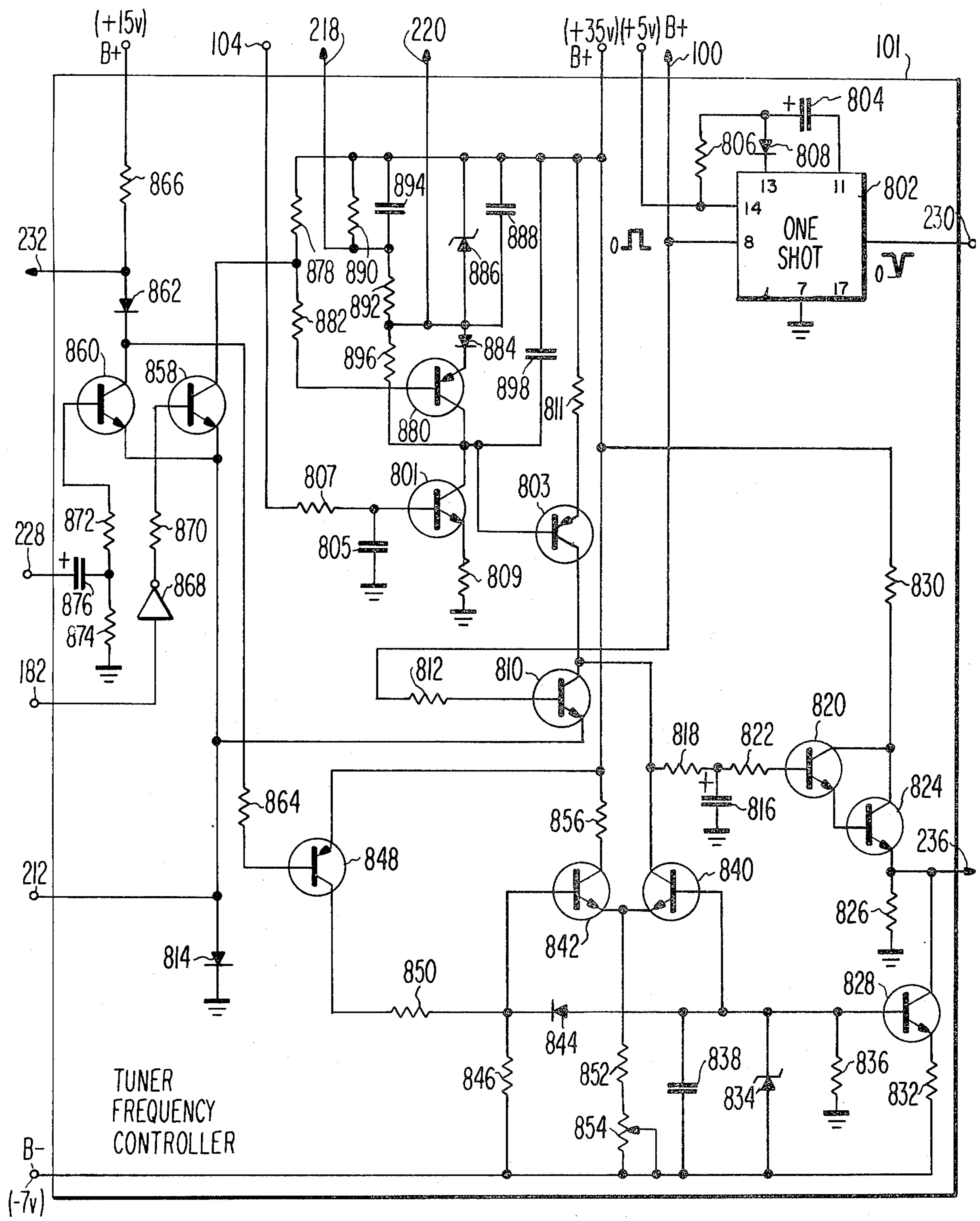
FIG. 3 illustrates in schematic form a tuner frequency controller constructed in accordance with the present invention.

In FIG. 3, the tuner frequency controller 101 provides a voltage at terminal 236 which is suitable for sweeping each of the tuners 12 and 14 through their tuning ranges and which is controlled in a manner to hold such tuners at appropriate frequencies corresponding to television channel frequencies. Specifically, the voltage at terminal 236 may be reset to approximately zero volts by means of a negative bandswitch reset pulse on terminal 230, swept through a voltage range of approximately zero to 30 volts when zero volts exist at terminal 182, held at a desirable voltage while providing for minor alterations of voltage level by means of a voltage applied to terminal 104 when the voltage at terminal 182 is positive, and changed a fixed amount when the voltage on terminal 228 goes positive.

In the tuner frequency controller 101, the voltage required to properly control tuners 12 and 14 (FIG. 1) is developed across a capacitor 816 and coupled to terminal 236 by means of an impedance transforming circuit comprising transistors 820, 824, 828 and associated components. A positive current charging source transistor 803 and a negative current charging source transistor 840 are coupled to capacitor 816 to provide for control of the charge on the capacitor 816 in accordance with the difference between the current produced by transistors 803 and 840. A sweep control transistor 858 is coupled to transistor 803 via a transistor 880, and in incremental sweep transistor 860 is coupled to transistor 840 via transistors 848 and 842 to provide for alteration of the voltage on capacitor 816 when either transistor 858 or transistor 860 is saturated. A capacitor 876 and resistors 872 and 874 coupled between terminal 228 and the base of transistor 860 provide for saturation of transistor 860 for an incremental period of time after a positive voltage is applied to terminal 228. The terminal 182 is coupled via an inverting amplifier 868 to the base of transistor 858 thereby providing for saturation of transistor 858 in response to a zero voltage at terminal 182.

A one shot 802 is coupled to capacitor 816 via a discharge transistor 810 to accomplish a discharge of capacitor 816 in response to a negative pulse at terminal 236. Transistors 801 and 880 are coupled to transistor 803 to provide for alterations of the voltage on capacitor 816 in response to a variation in an automatic fine tuning correction voltage coupled to terminal 104.

In operation, the tuner frequency controller 101 functions to reset, sweep, hold or impulse change the voltage at terminal 236 to provide for proper control of the UHF tuner 12 or the VHF tuner 14 (FIG. 1).

Reset

When a pulse (e.g., of negative polarity and having a four volt reference level) occurs at terminal 230 as a result of completion of entry of selected channel data into memory 148 (FIG. 1), a pulse (e.g., positive polarity and having a zero voltage reference) occurs at pin 8 of one-shot integrated circuit 802. This pulse is provided to reset bandstart latch 97 (FIG. 1) via terminal 100 and to the base of the discharge transistor 810. Transistor 810 conducts in saturation and a collector voltage of approximately 1 volt (voltage drop across diode 814 plus the collector to emitter saturation potential of transistor 810) is produced causing capacitor 816 to discharge to such voltage. After the period of the pulse at pin 8 of the oneshot integrated circuit 802, the transistor 810 reverts to a cutoff condition.

Sweep

In the sweep mode, the voltage on terminal 182 is approximately zero volts as a result of a lack of a hold signal from hold latch 170 (FIG. 1). The output of the inverting amplifier 868 provides a positive voltage which produces saturation of the transistor 858. The transistor 858 in saturation, the collector voltage is approximately one volt (the voltage drop across diode 814 plus the saturation potential of the transistor 858). Therefore, the transistor 848 is saturated by virtue of its emitter being coupled to B+ (+35 volts) and its base coupled to the collector of transistor 858. Transistor 842 is then also switched into saturation, causing transistor 840 to cut off.

In addition, the saturation of the transistor 858 provides for saturation of the transistor 880 and a stabilization of the voltage between the base of the transistor 803 and B+ (+35 volts), therefore providing for a constant collector current in transistor 803. Since transistor 810 and transistor 840 are in cutoff, the collector current of transistor 803 flows into the capacitor 816 developing a ramp of voltage during the saturation of transistor 858. The voltage that is developed across the capacitor 816 is coupled via transistors 820 and 824 to terminal 236.

Hold

Once the capacitor 816 has reached a level of charge which provides for tuning of either UHF tuner 12 or VHF tuner 14 (FIG. 1) to a frequency where a hold signal occurs (i.e., match between counter 118 and memory 148), the voltage at terminal 182 goes positive which results in a zero voltage at the output terminal of inverting amplifier 868 and a cutoff of the transistor 858. With transistor 858 cut off, transistor 880 is cut off and the collector potential of transistor 801 is determined by the voltage on terminal 104 which is at the AFT correction voltage. Therefore, as the automatic fine tuning correction voltage at terminal 104 varies, the collector voltage of transistor 801 also varies, thereby changing the voltage applied to the base of transistor 803. As the voltage on the base of transistor 803 varies, the collector current is altered, thereby changing the positive charging current supplied to the capacitor 816.

Also, with the transistor 858 cut off, the transisto 848 is cut off, transistor 842 is cut off, and current i flowing in the collector of transistor 840. A portion o the collector current of transistor 803 is therefore di verted from capacitor 816, stopping the ramp of th voltage terminal 236 and holding it constant. The dif ferential current between the collector current of tran sistor 803 and the collector current of transistor 840 i maintained approximately equal to the leakage curren in the capacitor 816 and associated components by th variations in the current of transistor 803 effected b the automatic fine tuning correction voltage at termina 104.

Impulse Change

When a positive voltage is applied to terminal 228 which occurs when terminal 226 of channel 5 and 6 calibration frequency translator 58 (FIG. 1) goes posi tive due to a selection and subsequent accumulation o a count of "05" or "06" in the counter, the termina 228 goes positive and the transistor 860 is saturated fo a period determined by the resistor 872, the resisto 874 and the capacitor 876. During the period of saturation of the transistor 860, transistor 880 is saturated providing for a fixed collector current in the transisto 803, the saturation of the transistor 848 and the transistor 842 and cutting off the negative current source transistor 840. The capacitor 816 is therefore charged for a period during which the transistor 860 is saturated. The change of voltage on capacitor 816 results in an increase of the oscillator signal frequency of VHF tuner 14 by approximately 4 MHz.

One particular configuration corresponding to that illustrated in FIGS. 1–3 is set forth below in terms of component types.

| | | |
|---|---|---|
| One Shot 802 | 9601 | Fairchild |

What is claimed is:

1. A television tuning system comprising:

tuning means for receiving radio frequency signals corresponding to any one of a plurality of television channels and having a tunable local oscillator means for producing a corresponding oscillator signal, certain of said oscillator signal frequencies having a uniform frequency of separation and at least one of said oscillator frequencies having a different frequency of separation from an adjacent channel oscillator frequency;

sweep generator means coupled to said oscillator means for varying the tuning thereof in a predetermined manner;

signal generating means for producing a plurality of reference signals at frequencies having said uniform frequency separation;

frequency translating means coupled to said local oscillator means for selective translation of said oscillator signal frequencies;

frequency discriminator means having first and second inputs coupled to said frequency translating means and to said signal generating means, respectively, for producing an output signal representative of frequency differences between said selectively translated oscillator signal frequencies provided by said frequency translating means and each of said reference signals as said tuning is varied;

counting means coupled to said discriminator means for producing an output count representative of said oscillator signal passing through a predetermined frequency relationship with respect to each of said reference signals;

channel selector means for producing a stored count representative of a selected television channel;

comparator means coupled to said counting means and to said channel selector means for providing a hold signal to said sweep generator means in response to a match between said output count and said stored count, thereby terminating said variation of said oscillator frequency;

decoder means coupled to said counting means for identifying the presence of at least one particular output count;

said frequency translating means being responsive to said particular output count and said hold signal for said translation of said oscillator signal frequencies; and frequency shifting means coupled to said frequency translating means for changing said oscillator frequency by a shift frequency equal to the difference between said different frequency of separation and said uniform frequency of separation.

2. The combination as in Claim 1 wherein said frequency translating means comprises:

means for providing a control signal in response to said particular output count and said hold signal;

signal switching means coupled to said means for providing a control signal and being responsive thereto for providing a first switching state in the absence of said control signal and a second switching state in the presence of said control signal;

a source of signal coupled to said means for providing a control signal and providing a fixed frequency signal when said control signal is present;

signal mixing means coupled to said source of signal and to said frequency discriminator means;

said signal switching means providing for coupling between said local oscillator means and said frequency discriminator means when said switching means is in said first switching state;

said signal switching means providing for coupling between said local oscillator means and said signal mixing means when said signal switching means is in said second switching state; and said signal mixing means providing mixing of said oscillator signal and said fixed frequency signal when said switching means is in said second switching state.

3. The combination as in claim 2 wherein said signal switching means comprises:

a bistable means coupled to said coupled signal for providing a first switching signal in the absence of said control signal and for providing a second switching signal in the presence of said control signal;

a first controllable switching means coupled between said local oscillator means and said frequency discriminator means and to said bistable means for providing for efficient oscillator signal flow between said local oscillator means and said frequency discriminator means in response to said first switching signal; and a second controllable switching means coupled between said local oscillator means and said signal mixing means and to said bistable means for providing for efficient oscillator signal flow between said local oscillator means and said signal mixing means in response to said second switching signal.

4. The combination as in claim 3 wherein said first controllable switching device is a first unilateral conducting device poled for efficient oscillator signal flow in the presence of said first switching signal and said second controllable switching device is a second unilateral conducting device poled for efficient oscillator signal flow in the presence of said second switching signal.

5. The combination as in claim 4 wherein said first unilateral conducting device is coupled to said frequency discriminating means by means of a bandpass filter.

6. The combination as in claim 5 and further comprising:

a third controllable switching means coupled between a junction of said first unilateral conducting device and said bandpass filter reference potential and coupled to said bistable means for providing for efficient oscillator signal flow between said junction and reference potential in response to said second switching signal.

7. The combination as in claim 2 wherein said signal mixing means is coupled to said local oscillator means by means of an input bandpass filter means for reducing the range of frequencies coupled to said signal mixing means.

8. The combination as in claim 2 wherein said signal mixing means is coupled to said frequency discriminating means by means of an output bandpass filter means for reducing the range of frequencies coupled to said second terminal.

9. The combination as in claim 2 wherein said fixed frequency signal of said source of signal is equal to an integer multiple of said uniform frequency of separation minus said shift frequency.

10. The combination as in claim 2 wherein said fixed frequency signal of said source of signal is equal to an integer multiple of said uniform frequency of separation plus said shift frequency.

11. The combination as in claim 10 wherein said fixed frequency signal of said source of signal is equal to 52 megahertz.

12. The combination as in claim 1 wherein said frequency shifting means inhibits said hold signal coupled to said sweep generator for a predetermined period of time after said translation of said oscillator signal.

13. The combination as in claim 12 wherein said frequency shifting means comprises:

a differentiating means coupled to said frequency translating means for producing a pulse for said predetermined period of time after said translation of said oscillator signal frequencies;

switch means coupled to said differentiating means for inhibiting said hold signal coupled to said sweep generator when said pulse is produced by said differentiating means.

14. The combination as in claim 1 wherein said at least one particular output count of said decoder is six.

15. The combination as in claim 1 wherein said frequency translating means comprises:

means for providing a control signal in response to said particular output count and said hold signal;

signal switching means coupled to said means for providing a control signal and being responsive thereto for providing a first switching state in the absence of said control signal and a second switching state in the presence of said control signal;

said signal switching means providing for coupling between a first terminal coupled to said local oscillator and a second terminal coupled to said frequency discriminator means when said switching means is in said first switching state;

said signal switching means providing for coupling between said first terminal and a third terminal when said signal switching means is in said second switching state;

a source of signal coupled to said means for providing a control signal and providing a fixed frequency signal when said control signal is present;

signal mixing means coupled to said source of signal and to said third terminal for providing mixing of said oscillator signal at said third terminal and said fixed frequency signal when said switching means is in said second switching state; and means coupling said signal mixing means to said second terminal for providing said translated signal to said tuning system.

16. The combination as in claim 15 wherein said signal switching means for providing a first switching state and a second switching state comprises:

a bistable means coupled to said control signal for providing at a first output terminal a first switching signal in the absence of said control signal and for providing at a second output terminal a second switching signal in the presence of said control signal;

a first controllable switching means coupled between said first terminal and said second terminal and to said first output terminal for providing for efficient oscillator signal flow between said first terminal and said second terminal in response to said first switching signal; and a second controllable switching means coupled between said first terminal and said third terminal and to said second output terminal for providing for efficient oscillator signal flow between said first terminal and said second terminal in response to said second switching signal.

17. The combination as in claim 16 wherein said first controllable switching device is a unilateral conducting device poled for efficient oscillator signal flow in the presence of said first switching signal and said second controllable switching device is a unilateral conducting device poled for efficient oscillator signal flow in the presence of said second switching signal.

18. The combination as in claim 17 wherein said unilateral conducting device is coupled to said second terminal by means of a bandpass filter.

19. The combination as in claim 18 and further comprising:

a third controllable switching means having a fourth terminal coupled to said unilateral conducting device and said bandpass filter and a fifth terminal coupled to reference potential and said second output terminal for providing efficient oscillator signal flow between said fourth terminal and said fifth terminal in response to said second switching signal.

20. The combination as in claim 15 wherein said means coupling said signal mixing means to said source of signal comprises:

an input bandpass filter means for reducing the range of frequencies coupled to said signal mixing means.

21. The combination as in claim 15 wherein said means coupling an output terminal of said signal mixing means to said second terminal comprises:

an output bandpass filter means for reducing the range of frequencies coupled to said second terminal.

* * * * *